United States Patent [19]

Nihei et al.

[11] Patent Number: 4,999,096
[45] Date of Patent: Mar. 12, 1991

[54] METHOD OF AND APPARATUS FOR SPUTTERING

[75] Inventors: Masayasu Nihei; Jin Onuki; Yasushi Koubuchi; Kunio Miyazaki, all of Hitachi; Tatsuo Itagaki, Tokyo, all of Japan

[73] Assignee: Hitachi, Ltd., Tokyo, Japan

[21] Appl. No.: 213,136

[22] Filed: Jun. 29, 1988

[30] Foreign Application Priority Data

Jun. 30, 1987 [JP] Japan ................ 62-163092
Mar. 16, 1988 [JP] Japan ................ 63-60421

[51] Int. Cl.$^5$ ............................ C23C 14/34
[52] U.S. Cl. ............... 204/192.3; 204/192.15; 204/192.32; 204/298.03; 204/298.06; 204/298.08; 204/298.34
[58] Field of Search .......... 204/298 TT, 298 PS, 204/192.12, 192.3, 192.32, 192.15, 298.03, 298.06, 298.08, 298.34

[56] References Cited

U.S. PATENT DOCUMENTS

| | | | |
|---|---|---|---|
| 3,761,375 | 9/1973 | Pierce et al. | 204/192.3 X |
| 4,123,316 | 10/1978 | Tsuchimoto | 204/192.3 X |
| 4,336,118 | 6/1982 | Patten et al. | 204/192.3 X |
| 4,692,230 | 9/1987 | Nihei et al. | 204/192.12 X |
| 4,756,810 | 7/1988 | Lamont, Jr. et al. | 204/298 |
| 4,816,126 | 3/1989 | Kamoshida et al. | 204/192.3 |

FOREIGN PATENT DOCUMENTS 2004864 1/1987 Japan ................ 204/298

Primary Examiner—Nam X. Nguyen
Attorney, Agent, or Firm—Antonelli, Terry, Stout & Kraus

[57] ABSTRACT

A thin film forming method and apparatus is provided, wherein a negative voltage is applied alternately to a target and a substrate to perform film formation and reverse sputter alternately. Further, a coil is mounted between the target and the substrate and a high frequency current is made to flow therethrough to generate plasma. A negative base voltage smaller in absolute value than that during sputter may be applied to the substrate to make a fraction of Ar ions to flow into the substrate while it is subjected to reverse sputter. Thus, a film whose step coverage is 0.3 or more is possible. It becomes also possible to hold stable discharge and reverse sputter at a high vacuum region. The pressure of an Ar atmosphere may be lowered to $10^{-3}$ Torr or less. A film whose peak value of x-ray diffraction strength in the (111) plane is 150 Xcps or more is possible. Also, a barrier layer with a layered structure of granular and columnar crystals or a mixed structure thereof and hence with an efficient barrier effect and a large specific resistance is possible.

20 Claims, 9 Drawing Sheets

○ : Aℓ SPUTTER PARTICLE
⊕ : Ar ION
● : IMPURITIES : NITROGEN, OXYGEN, HYDROGEN ····

FIG. 5

SPUTTER    REVERSE SPUTTER    SPUTTER    REVERSE SPUTTER

○: Al SPUTTER PARTICLE
⊕: Ar ION
⊘: IMPURITIES: NITROGEN, OXYGEN, HYDROGEN ····

STEP COVERAGE: $(L_2/L_1) \times 100$ (%)
ASPECT RATIO: $S_2/S_1$

METHOD OF AND APPARATUS FOR SPUTTERING

BACKGROUND OF THE INVENTION

1. FIELD OF THE INVENTION

The present invention relates to a method of and apparatus for forming a thin film through ion impact, and to circuit devices having such a thin film. The invention is particularly suitable for application to barrier layers or wiring films of large scale integrated circuits.

2. DESCRIPTION OF THE PRIOR ART

Figure 16:
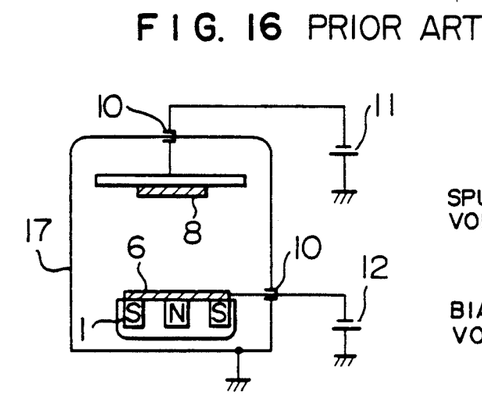
FIG. 16 shows the structure of a conventional DC magnetron bias sputter apparatus.
Figure 17:
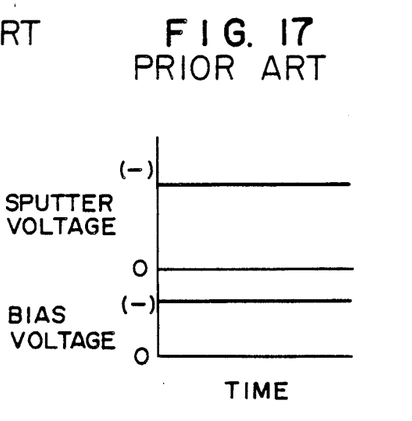
FIG. 17 shows examples of waveforms used in the apparatus shown in FIG. 16.
Figure 21:
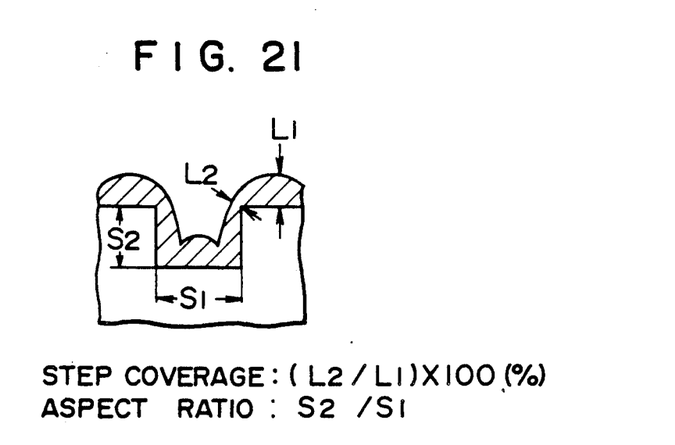
FIG. 21 is a view used for explaining an aspect ratio and step coverage.

As the density of integration in large scale integrated circuits (LSIs) or very large scale integrated circuits (VLSIs) becomes high, the diameters of contact holes between a silicon substrate and an aluminum wiring film and of through holes between aluminum wiring layers become small, resulting in a larger aspect ratio as shown in FIG. 21. With a magnetron sputter method commonly used in the art, as the aspect ratio becomes near 1, the step coverage shown in FIG. 21 becomes poor due to the shadowing effect during sputter deposition of wiring material, so that wiring failure due to an increase in wiring resistance or electromigration may occur. To eliminate such disadvantages, a bias sputter method, as disclosed in Japanese Patent Unexamined Publication JP-A-61-261472 (corresponding to EP-A-202572) and Japanese Patent Unexamined Publication JP-A-61-214174 (no corresponding foreign application), has been developed whereby a film is formed while applying negative voltages to a target and a substrate at all times. The principle of a DC magnetron bias sputter method is exemplarily shown in FIG. 16. A sputter DC power source 12 is connected to a target 6, while a bias (reverse sputter) DC power source 11 is connected to a substrate 8. These negative electrodes are always supplied with DC negative voltages as shown in FIG. 17 during film formation so that a film is formed while the substrate 8 is being subjected to Ar ion impact (reverse sputter). Therefore, the step coverage is improved as compared with the sputter method employing no bias voltage. In FIG. 16, reference numeral 7 denotes magnets, 10 insulators, 17 a vacuum chamber.

However, it has been found that the crystal orientation (111) of an aluminum wiring film formed by the bias sputter method becomes considerably degraded. It is known that the orientation of crystalline grains is related to electromigration and stressmigration, and the more the orientation becomes excellent, the more the tolerance against electromigration and stressmigration is improved. It has also been found that the bias sputter method may cause cracks in a barrier layer and an inferior barrier effect.

SUMMARY OF THE INVENTION

It is an object of the present invention to provide a thin film forming method and apparatus capable of improving the step coverage and quality of an aluminum wiring film of integrated circuit devices.

It is another object of the present invention to provide a sputtering or vapor deposition method for practicing the thin film forming method as above.

It is a further object of the present invention to provide an integrated circuit device having a wiring film with an improved film quality and step coverage.

It is still a further object of the present invention to provide an aluminum wiring film for integrated circuit devices.

According to the film forming method of this invention, a negative voltage is applied alternately to a target and a substrate to perform film formation and reverse sputter alternately.

The factors affecting the orientation of crystalline grains are impurity gasses such as $O_2$, $N_2$, $H_2O$ and the like residual in a vacuum chamber. Admixture of impurity gasses into sputter particles produces crystalline nuclei with different crystal orientations and deposition defects during a growth process, to thereby lower the film quality.

Figure 4:
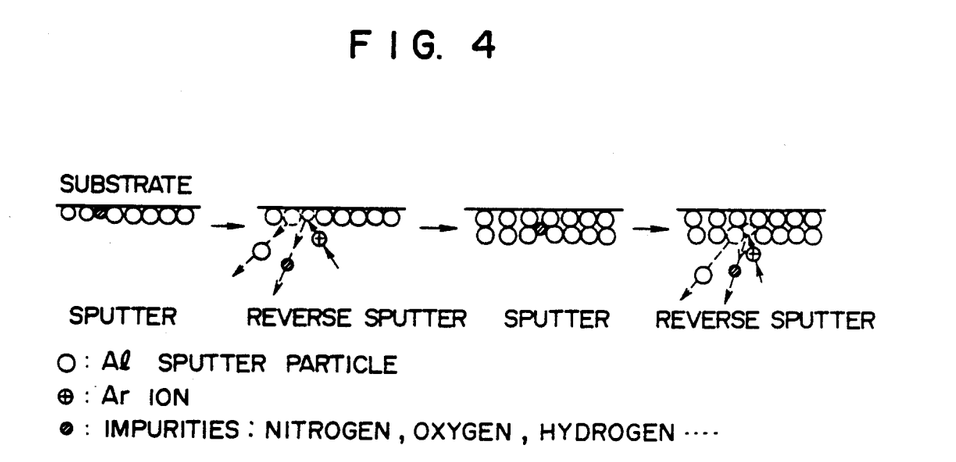
FIGS. 4 and 5 illustrate a film forming mechanism according to the present invention.
Figure 5:
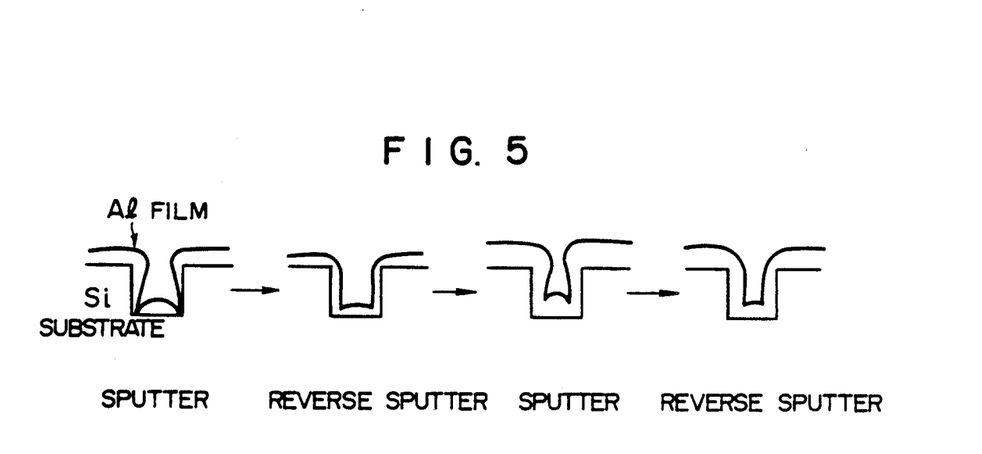
Figure 18:
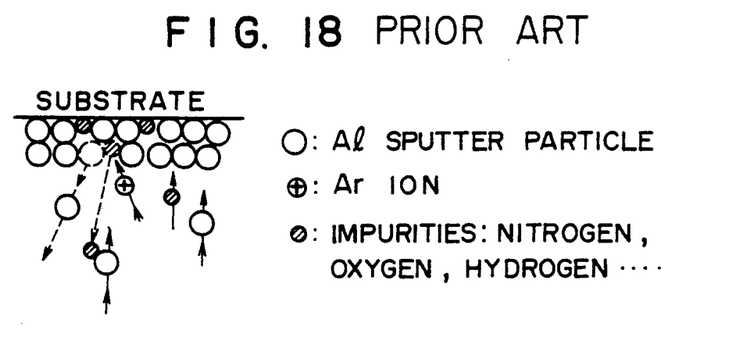
FIG. 18 illustrates a film forming mechanism associated with FIGS. 16 and 17.

FIG. 18 diagrammatically shows a film forming mechanism of a conventional DC magnetron bias sputter method. Since the substrate 8 and the target 6 are always energized by negative voltages as shown in FIGS. 16 and 17, parts of aluminum and impurities deposited on the substrate are subjected to reverse sputter. Reverse sputtered impurities are dissociated and activated in atomic state, which impurities are admixed again with aluminum sputter particles from the target, thereby further degrading the film quality. According to the present invention, negative voltages whose waveforms are schematically shown in FIG. 2 are applied alternately to the target and the substrate to solve the above problems. FIGS. 4 and 5 illustrate a film forming mechanism of this invention. Aluminum sputter particles are deposited onto the substrate with a negative voltage being applied to the target. At this process, residual impurity gasses in the vacuum chamber are introduced into the inside of the film on the substrate surface. Next, the voltage applied to the target is turned off and a negative voltage is applied to the substrate, whereby a fraction of aluminum and impurities deposited onto the substrate are subjected to reverse sputter by Ar ion impacts to thereby clean and shape the film. The above processes are alternately and continuously repeated so that a film with a good orientation and step coverage is formed. According to the present invention, a step coverage 0.3 or more is possible. When a film is formed on a substrate with a recess, the film is substantially parallel to the underneath surface of the substrate at the bottom and side walls of the recess and the upper side surrounding the recess and inclined at the edge of the recess. The principle idea of this invention has been given above. However, if sputter and bias voltages are alternately turned off to 0 voltage, the film forming discharge range is limited. The reason is as follows: As illustrated in the apparatus of this invention shown in FIG. 1, magnets 7 are provided on the target for focussing plasma and enabling sputter discharge at a pressure in the order of $10^{-3}$ Torr. However, since no magnets are provided on the substrate 8, discharge does not occur even if a negative voltage is applied to the substrate. Thus, the substrate is not subjected to reverse sputter. However, if a coil 5 is mounted between the target 6 and the substrate 8 and a high frequency current is made to flow therethrough to generate plasma, then it becomes possible to hold stable discharge and reverse sputter at high vacuum region. According to the present invention, the pressure of Ar atmosphere may be lowered to $10^{-3}$ Torr or less. Accordingly, discharge between the target 6 and the electrically grounded vacuum chamber 17 completely diminishes, and discharge between the substrate and the grounded vacuum chamber can be effected if the substrate is energized to some voltage level. Under certain film forming conditions, the discharge (bias current) may become insufficient. In such case, according to the present invention, as seen from the waveforms shown in FIG. 3, after a negative voltage is switched from the target to the substrate, sputter discharge is caused to continue by applying a negative base voltage (power) smaller in absolute magnitude than that during sputter (during film forming), to the substrate without making it zero. As a result, parts of Ar ions flow into the substrate which is then subjected to reverse sputter. If the absolute value of this base voltage is made too high, the amount of impurities introduced again into the film becomes large so that an optimum absolute value of the base voltage must be determined. In addition to the above factors, other factors such as switching period, conduction ratio of bias to sputter and the like are selected properly to greatly improve the film characteristic and step coverage.

It is preferable to use a DC bias switching sputter in case of a conductive metal film, and to use a high frequency bias switching sputter in case of an insulating film.

According to a sputter method of this invention, it is possible to set the pressure of Ar gas within a vacuum chamber at $10^{-3}$ Torr or less. Therefore, admixture of impurities contained in the atmosphere such as $O_2$, $N_2$, $H_2O$ or the like into the film can be suppressed to accordingly obtain a good film quality. If the film forming method of this invention is applied to forming an aluminum wiring film of an integrated circuit device, it is possible to obtain a film whose peak value of x-ray diffraction strength in (111) plane is 150 Kcps or more, and whose step coverage is 0.3 or more. By virtue of these, it becomes possible to make a wiring breakage due to electromigration difficult to occur.

The effect of enabling to prevent occurrence of electromigration of a wiring film can be enjoyed not only for pure aluminum wiring films but also for all Al alloy wiring films such as Al-Cu-Si alloy wiring films, Al-Pd-Si alloy wiring films, and Al-Si alloy wiring films. Not only pure aluminum but also Al alloy may be used accordingly as a wiring film of an integrated circuit device.

If the film forming method of this invention is applied to a barrier layer of an integrated circuit device, the resultant barrier layer has a layered structure of granular and columnar crystals or a mixed structure thereof so that it has an efficient barrier effect and a large specific resistance.

A material of a barrier layer is preferably TiN and TiW, however the invention is not limited thereto.

The film forming method of this invention is applicable not only to an integrated circuit device but also to all the devices where a conductive film or an insulating film is formed on a substrate.

According to the film forming method of this invention, it is preferable to ground a vacuum chamber and apply negative pulse voltages alternately to both a target and a substrate.

It is also preferable to set the peak value of a pulse applied to the target higher than the peak value of a pulse applied to the substrate.

It is preferable to set the time during which a negative pulse voltage is applied to the target longer than that during which a negative pulse voltage is applied to the substrate.

It is further preferable to set the base voltage to the target higher than that to the substrate.

DESCRIPTION OF THE PREFERRED EMBODIMENTS

EXAMPLE 1

Figure 1:
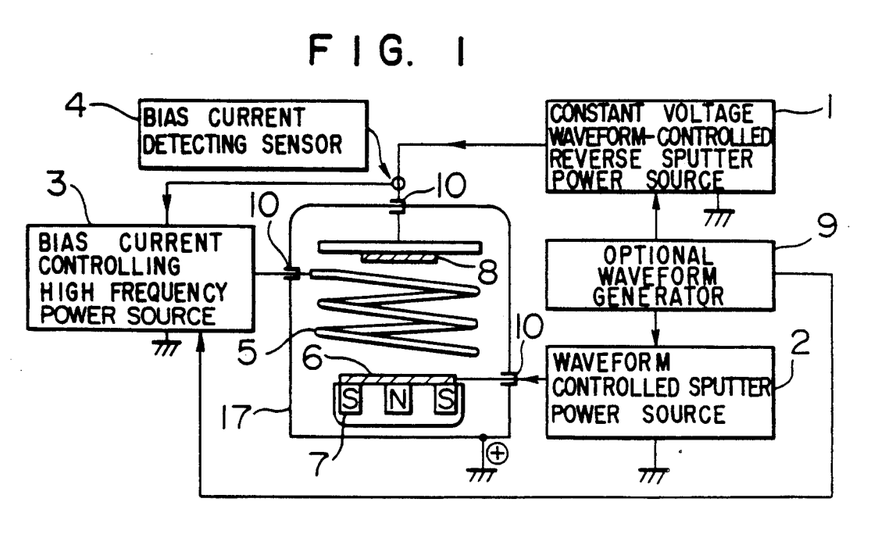
FIG. 1 is a schematic block diagram showing the structure of an embodiment of a thin film forming apparatus according to the present invention.
Figure 2:
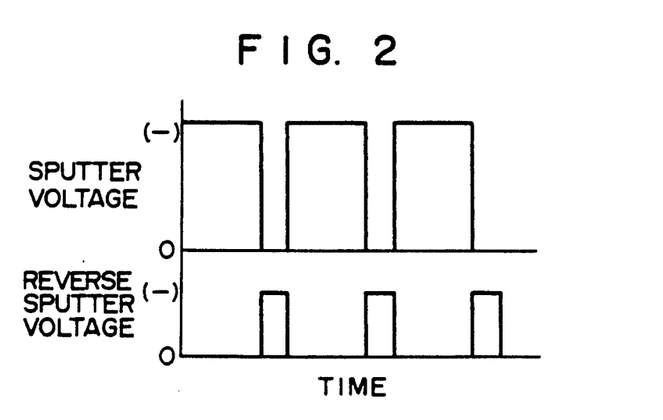
FIGS. 2 and 3 show examples of waveforms used in the apparatus shown in FIG. 1.
Figure 3:
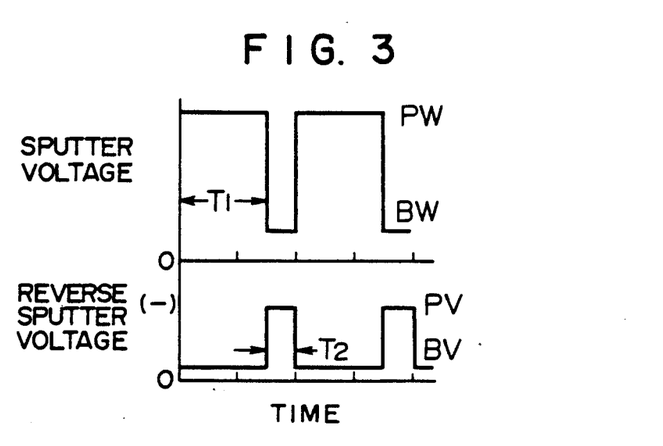

Referring to FIGS. 1 to 3, an embodiment of a thin film forming apparatus according to the present invention will be described. FIG. 3 diagrammatically shows waveforms used in the apparatus. In FIG. 3, PW denotes a sputter peak power (voltage), BW a sputter base power (voltage), PV a bias peak voltage, BV a bias base voltage, BW/PW a sputter base power ratio, T2/(T1+T2) a bias ratio, and (T1+T2) a switching period. Referring to FIG. 1, the thin film forming apparatus comprises a waveform-controlled sputter power source 2, a constant-voltage waveform-controlled reverse sputter power source 1, a bias current detecting sensor 4, a high frequency coil 5 for generating plasma, a bias current controlling high frequency power source 3 for controlling a bias current and enabling a stable discharge at a high vacuum region, a vacuum chamber 17 within which film is formed, a substrate (e.g., Si substrate) 8, a target 6, insulators 10, and an optional waveform generator 9 made of a CPU and the like for setting sputter power, bias voltage and current waveforms under program control.

With the thin film forming apparatus constructed as above, first the optional waveform generator 9 sets the sputter power waveform, bias (reverse sputter) waveform and bias current. These signals set by the optional waveform generator 9 are supplied to the waveform controlled sputter power source 2, constant-voltage waveform controlled reverse sputter power source 1 and bias current controlling high frequency power source 3. These power sources have feedback functions to maintain the waveforms as set, even under variation of loads or the like. Therefore, a change in any one set value will not affect the other values. A bias current control method which is one of the features of this invention will be described in detail. A bias current with the bias voltage PV set, e.g., at 150 V changes if for example a sputter power is changed. To avoid this, a bias current is detected by the bias current detecting sensor 4 and compared with a signal set by the optional waveform generator 9. Based on this comparison, the bias current is maintained at the set value by controlling a high frequency power supplied to the high frequency coil 5 by means of the bias current controlling high frequency power source 3. These operations serve to maintain stable discharge at a high vacuum region.

Figure 6:
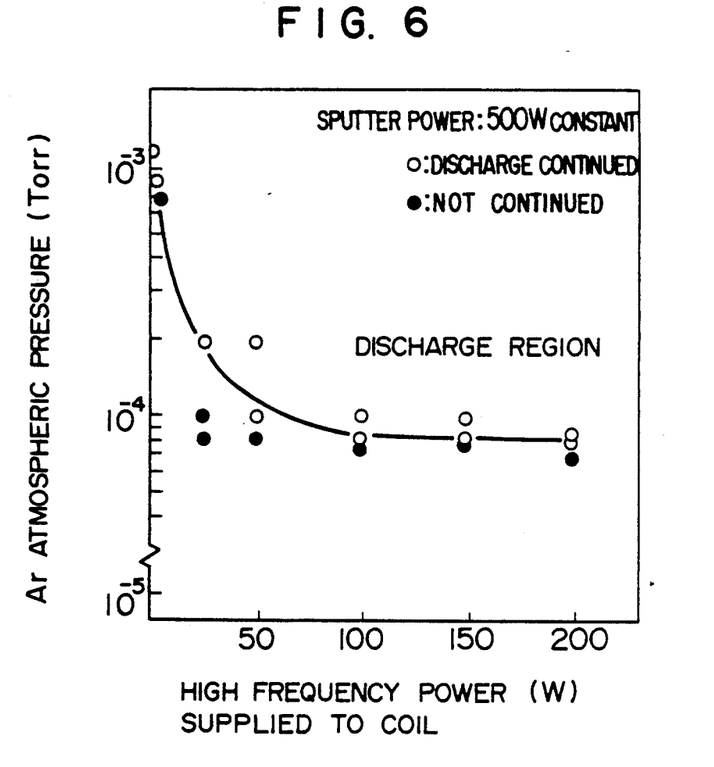
FIG. 6 is a characteristic curve illustrating a discharge limit pressure.

Next, the explanation will be made of forming a thin film by the thin film forming apparatus shown in FIG. 1 with reference to FIGS. 6 to 10. Thin film formation described below was made under the same conditions that a target was an Al-1 weight % Si alloy, a substrate was a Si wafer, an attained vacuum pressure was $3 \times 10^{-7}$ Torr, and a discharge pressure was $5 \times 10^{-4}$ Torr under an Ar atmosphere. The relation between a high frequency power (to be supplied to the coil) and an Ar atmospheric pressure, with respect to continuation of sputter discharge, is shown in FIG. 6 wherein a sputter power was set constant at 500 Watts and a high frequency power supplied to the coil was varied in the range of 0 to 200 Watts. The discharge limit pressure at a high frequency power of 0 Watt was $9 \times 10^{-4}$ Torr. However, as the high frequency power increased, the discharge limit pressure lowered. With the high frequency power at about 100 Watts, the discharge limit pressure lowered little and maintained substantially constant. With the high frequency power over 100 Watts, the discharge limit pressure remained $8 \times 10^{-5}$ Torr. As seen from the above, discharge according to this invention can be performed at a vacuum region ten times or more higher than that of a conventional DC magnetron sputter method, thus improving a film quality. The high frequency power is preferably in a range of 100 to 200 Watts as seen from FIG. 6.

Figure 7:
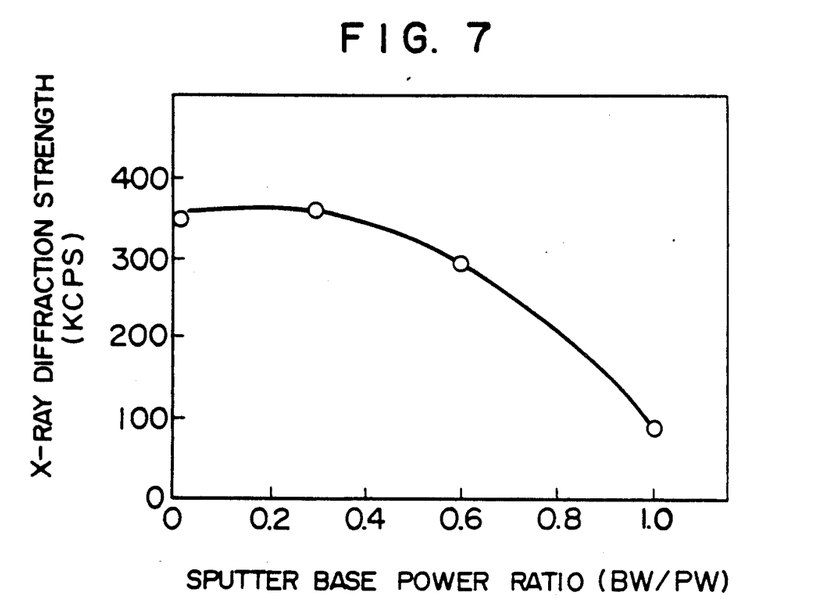
FIGS. 7 and 8 are characteristic curves of an x-ray diffraction strength relative to switching factors.

FIG. 7 shows the experimental result of studying influence of a sputter base power ratio on an x-ray diffraction strength at (111) orientation, with the conditions that a switching period (T1+T2) was 1 second, a bias peak voltage PV was 150 V, a bias base voltage BV was 50 V, a bias current was 0.3 A, and a sputter base power ratio (BW/PW) was changed from 0 to 1. The x-ray diffraction strength of 370 Kcps was obtained at about 0 to 0.3 of the sputter base power ratio. At a larger sputter base power ratio, the diffraction strength considerably lowered to the extent that the strength was 130 Kcps at a sputter base power ratio of 1. The reason why the x-ray diffraction strength is lowered as the sputter base power ratio approaches 1 is that since a sputter power undergoes continuous discharge in the similar manner as conventional, impurity gases ($N_2$, $O_2$, $H_2O$) are introduced into the inside of a film. The diffraction strength was 8 Kcps with a conventional method under the same conditions as above. It should be noted that the diffraction strength according to this invention was about fifty times as high as a conventional strength. The sputter base power ratio is preferably 0.8 or less, and more preferably 0.3 or less.

Figure 8:
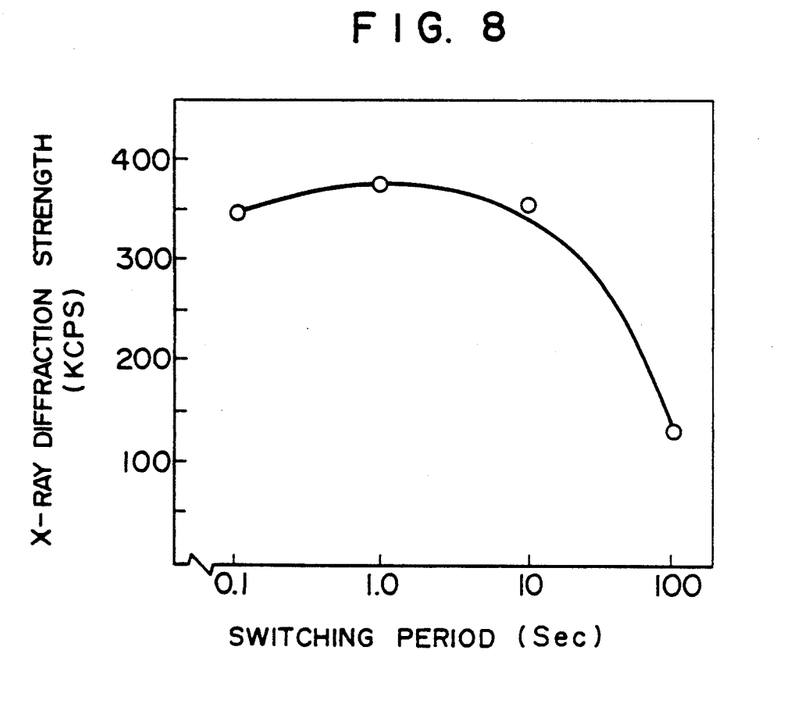

FIG. 8 shows the experimental result of studying influence of a switching period upon a diffraction strength, with the conditions that a sputter base power ratio was 0.3 which could obtain the maximum diffraction strength as shown in FIG. 7, and a switching period (T1+T2) was changed from 0.1 to 100 seconds. The x-ray diffraction strength was maintained substantially constant within the range of 0.1 to 10 seconds of the switching period, and considerably lowered at the period of 100 seconds. As appreciated, the switching period also becomes one of the important film formation factors so that it is necessary to change it in accordance with material and application field.

Figure 9:
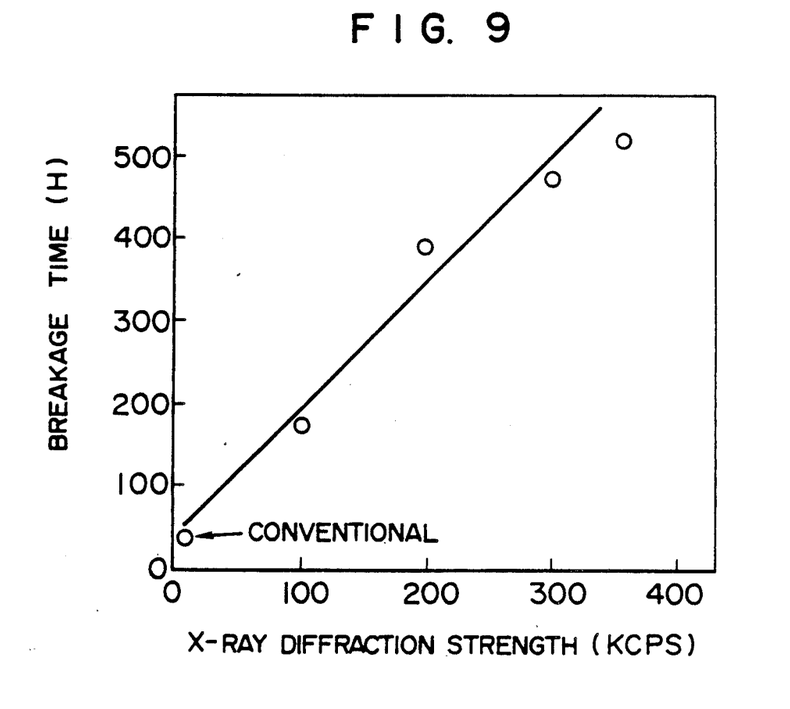
FIG. 9 is a characteristic line of a breakage time relative to an x-ray diffraction strength.

FIG. 9 shows the experimental result of studying influence of an x-ray diffraction strength at (111) orientation plane upon a wiring breakage due to electromigration. An Al-1 weight % Si alloy with the thickness of 0.5 microns was formed on a Si substrate and thereafter, a 2 mm long, 0.8 microns wide stripe pattern was formed thereon, and annealed at 450° C. for 60 minutes. 1 μm thick passivation $SiO_2$ film was made thereon by a CVD method. A time was measured till the wiring was broken at a current density of $2 \times 10^6$ A/cm$^2$ and under a temperature of 150° C. As seen from FIG. 9, it can be understood that as the x-ray diffraction strength increased to the range of 8 to 370 Kcps, the breakage time considerably increased to the range of 40 to 510 hours, thus presenting a certain correlation between the x-ray diffraction strength (orientation) and the electromigration resistance. The diffraction strength of a film formed by means of a conventional DC magnetron sputter method was 8 Kcps as shown in FIG. 9. The wiring breakage time of this film was 40 hours, whereas the film formed by this invention with a maximum diffraction strength of 370 Kcps exhibits a breakage time of 510 hours. Accordingly, the migration resistance of this invention was improved about 14 times as conventional.

Figure 10:
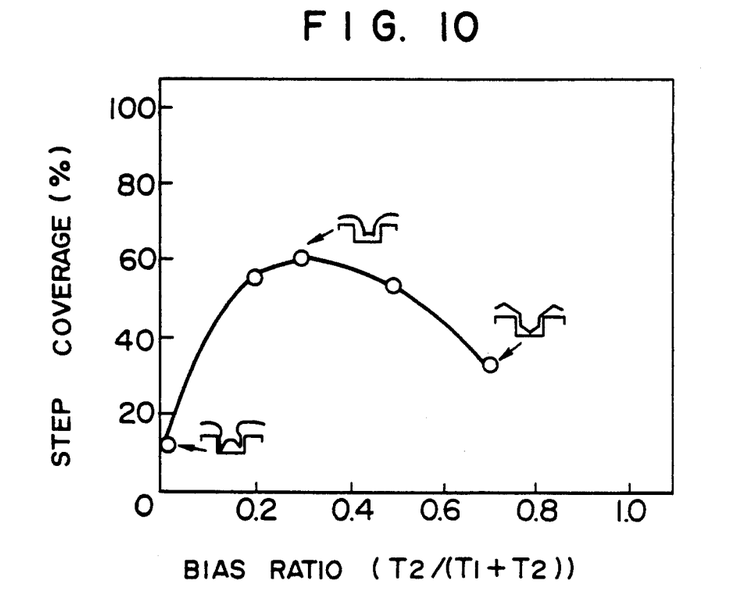
FIG. 10 is a characteristic curve of step coverage relative to a bias ratio.

FIG. 10 shows the result of studying influence of a bias ratio (T2/(T1+T2)) upon step coverage. Under the conditions that a switching period (T1+T2) was 1 second, a sputter base power ratio (BW/PW) was 0.3, and a bias peak voltage (PV) was 150 V, a pattern having a through hole diameter of 0.8 micron and an aspect ratio of 1 was formed on an Si substrate, and a film of Al-1 weight % Si alloy was formed thereon to study the step coverage state by using a scanning microwave spectrometer. The step coverage presented a maximum value 60% at a bias ratio 0.3, and it lowered at a ratio over and under 0.3. As seen from the film configuration at the through hole section shown in FIG. 10, the film configuration could vary with the bias ratio. For instance, it was possible to further improve the step coverage by setting the bias ratio large at the start of film formation and lowering it with time. The step coverage of a film formed by a conventional DC magnetron bias sputter method under the same bias voltage 150 V as of the present invention was 22%. The film configuration can be varied with the bias ratio according to the present invention. However, the conventional method fixes the bias voltage and no other factors remain so that the step coverage cannot be improved. With the conventional method, if the bias voltage is increased, the kinetic energy of ions increases so that the step coverage can be improved more or less. However, in this case, ion impact may damage the substrate and the film quality is degraded so much.

Figure 22:
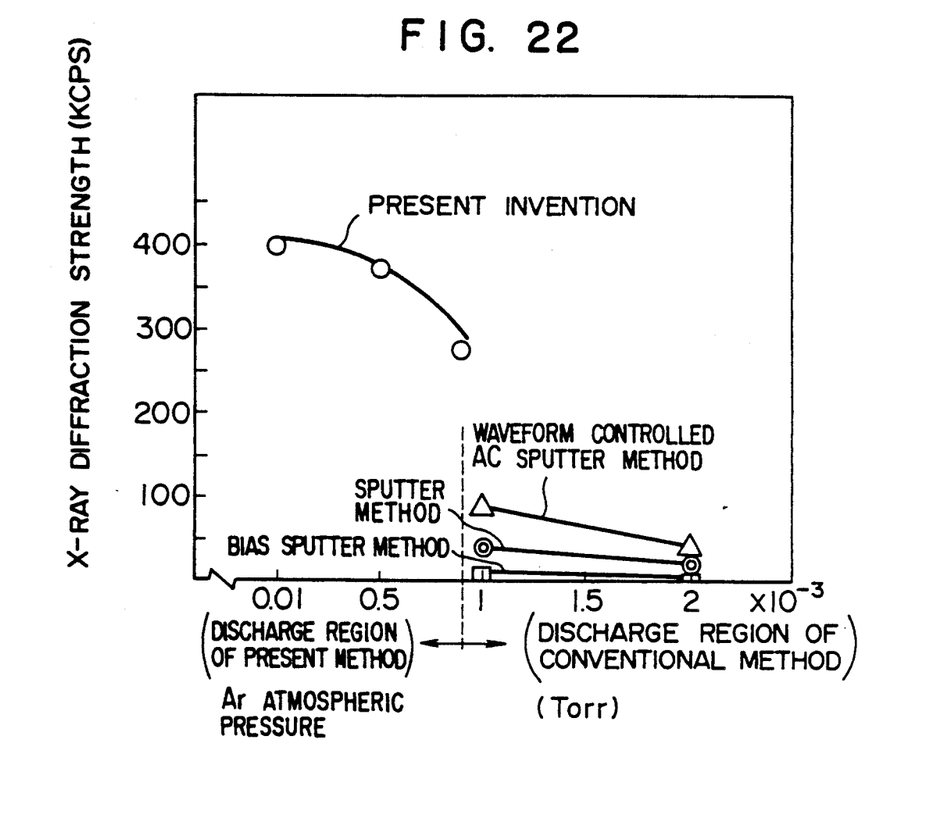
FIG. 22 shows characteristic curve and lines of an Ar atmospheric pressure relative to an x-ray diffraction strength during forming an Al film.

FIG. 22 shows the comparison results of conventional various methods with the method of this invention with respect to influence of an Ar atmospheric pressure upon the x-ray diffraction strength at (111) orientation of an Al film formed on an Si substrate, wherein the apparatus shown in FIG. 1 was used for film formation of this invention.

Film formation of this invention was made under the conditions that a switching period of sputtering relative to reverse sputtering was 1 second, a bias peak voltage was 150 V, a bias ratio was 0.3, and a sputter base power ratio was 0.3.

For those conventional methods shown in FIG. 22, the sputter method is such a method that does not undergo the reverse sputter, the bias sputter method is such a method that sputtering is carried out while a negative voltage is applied to a substrate, and the waveform controlling AC sputter method, as described in Japanese Patent Application No. 61-169590 (unexamined publication JP-A-63-26361), is such a method that sputtering is carried out using an AC voltage whose waveform is being controlled. With the method of this invention, film formation can be carried out at a pressure lower than $10^{-3}$ Torr so that the x-ray diffraction strength can be made considerably higher than conventional.

In contrast, the conventional methods can not be used at the Ar atmospheric pressure lower than $10^{-3}$ Torr and the x-ray diffraction strength is limited to 100 Xcps at most. The method of this invention has first succeeded in making the x-ray diffraction strength of an Al film at (111) plane higher than 150 Xcps.

EXAMPLE 2

Figure 11:
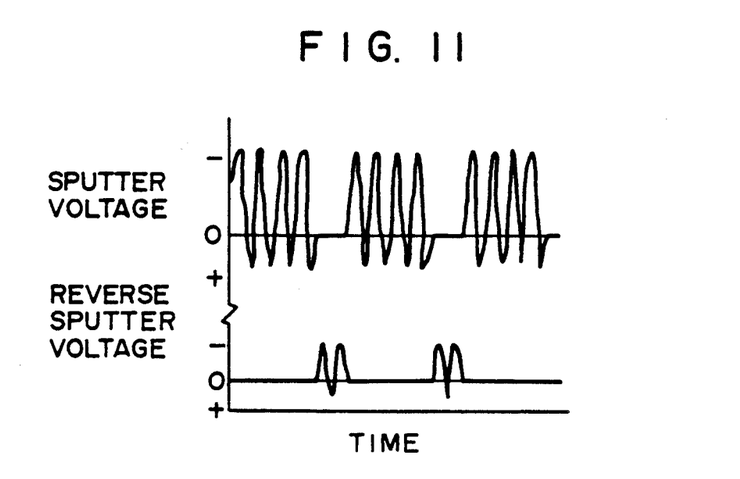
FIG. 11 shows examples of high frequency waveforms used for sputter and bias.
Figure 12:
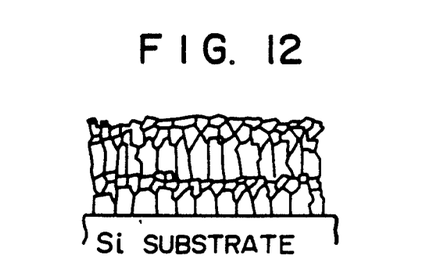
FIG. 12 schematically illustrates the structure of a TiN film formed according to this invention.

The DC sputter of Example 1 is effective for conductive targets, but a target of insulating material cannot be discharged. In Example 2, the waveform controlled sputter power source 2 and the constant-voltage waveform controlled reverse sputter power source 1 shown in FIG. 1 were replaced with high frequency power sources at about 13.5 MHz having waveforms as shown in the schematic diagram of FIG. 11, thereby allowing discharge of a target of insulating material. An Al film was formed and patterned in the manner described in Example 1, and thereafter an $SiO_2$ film as an inter-layer insulating film of a multi-layered wiring was formed thereon. Contact between step portions was excellent, and the surface unevenness was considerably improved.

EXAMPLE 3

Figure 20:
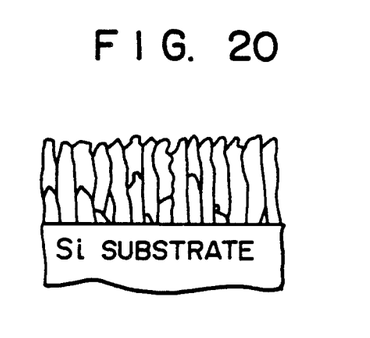
FIG. 20 is a diagrammatical view of the structure of a TiN film formed by a conventional DC magnetron sputter method without a bias.

Contact resistance increases largely for contact holes smaller than 1 micron, because the diameter of Si grains crystallized from an Al wiring film may sometimes exceed 1 micron. One of the methods for preventing this is to use a barrier metal. Various types of barrier metal are known. TiN is most prominent to prevent reaction between Al and Si. However, a TiN barrier film formed under an $(Ar+N_2+O_2)$ atmosphere with a Ti target is grown to have columnar crystals as shown by a film cross section of FIG. 20. According to the characteristics of this film, it has less residual stress, no defect such as cracks, and excellent barrier effect. However, it has a disadvantage of large specific resistance in the order of 1000 to 2000 $\mu\Omega$.cm.

Figure 19:
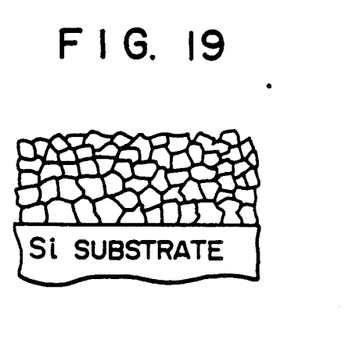
FIG. 19 is a diagrammatical view of the structure of a TiN film formed by a conventional DC magnetron bias sputter method.

On the other hand, a film formed by applying a negative bias (reverse sputter) to a substrate has fine and granular crystals as shown in FIG. 19. As compared with the above specific resistance, this film has a very low resistance in the order of 50 to 200 $\mu\Omega$.cm. However, it has large residual stress and is likely to generate cracks, and also has poor barrier effect.

Material having a small specific resistance and presenting excellent barrier effect is suitable for the barrier film material. However, in this respect, both the above-described methods are contradictory to each other and leave an obstacle against practical use. This has brought to the consideration that if a film is formed by alternately using sputter and reverse sputter, it becomes a layered film of columnar and granular crystals or a mixed film thereof which has both the above-mentioned advantageous features. Accordingly, a film was formed under the conditions that a switching period was 10 seconds, a bias ratio was 0.5, a sputter base power ratio was 0.3, a target was Ti, and an atmosphere was $Ar(7.5)+N_2(2)+O_2(0.5)$. The resultant film had a specific resistance in the order of 180 to 250 $\mu\Omega$.cm. After a thermal process at 450° C., there were no barrier layer breakage, no crystallization of Si from an Al wiring layer, and no cracks in the film. As above, a composite film can be formed by applying this invention to the reactive sputtering.

Figure 23:
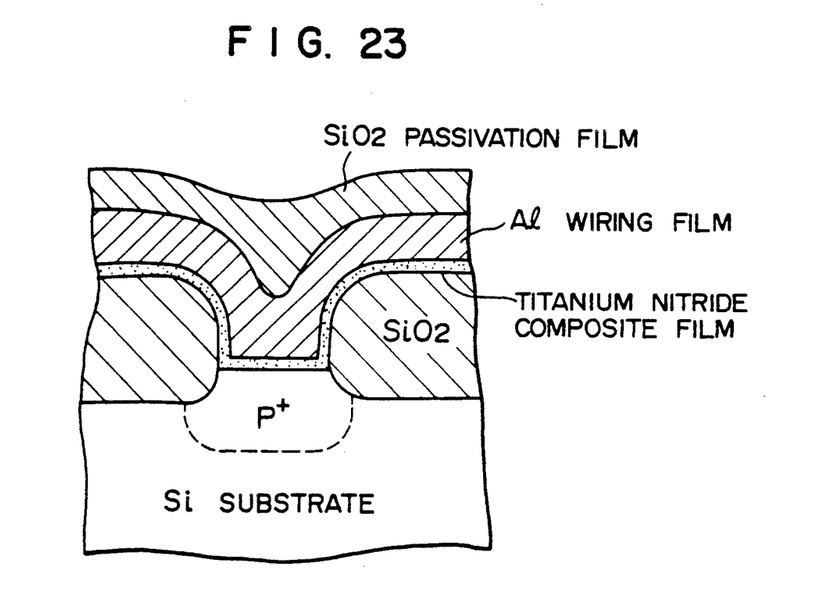
FIG. 23 is a partial, sectional view of an integrated circuit device which shows one of applications of this invention.

FIG. 23 shows the structure of an integrated circuit wherein a TiN film was formed on an Si substrate by using the above method, an Al wiring film was formed thereon, and an $SiO_2$ passivation film was covered over the entire surface of the circuit. The passivation film is not limited to $SiO_2$ only. The substrate is not also limited to Si, but other materials such as GaAs may be used.

EXAMPLE 4

Figure 13:
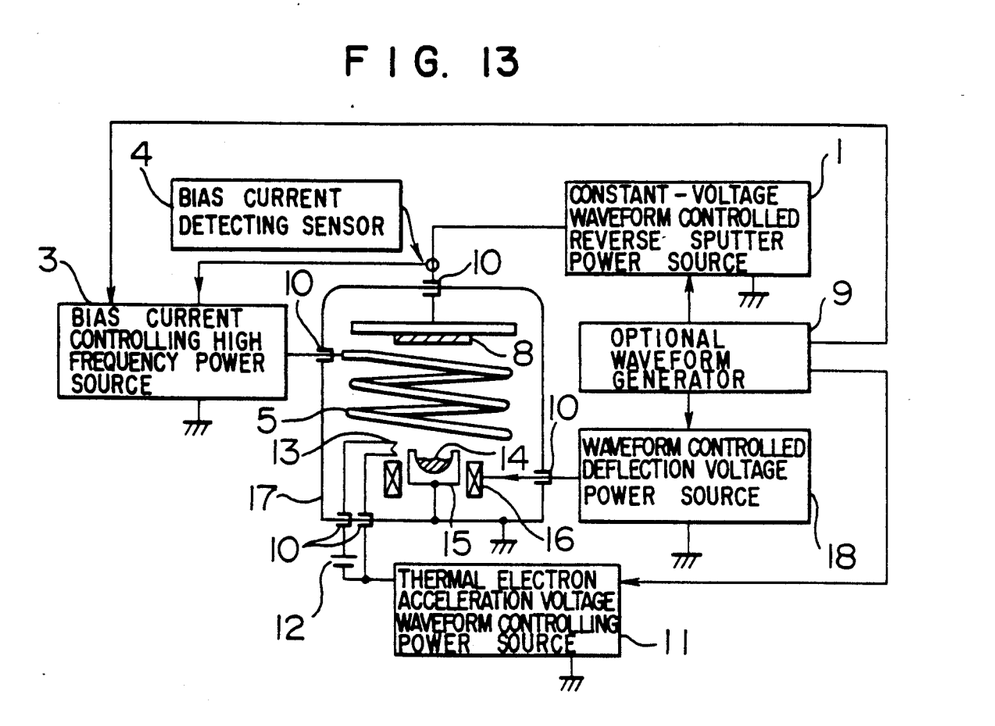
FIG. 13 is a schematic block diagram showing the structure of another embodiment of a thin film forming apparatus according to the present invention.
Figure 14:
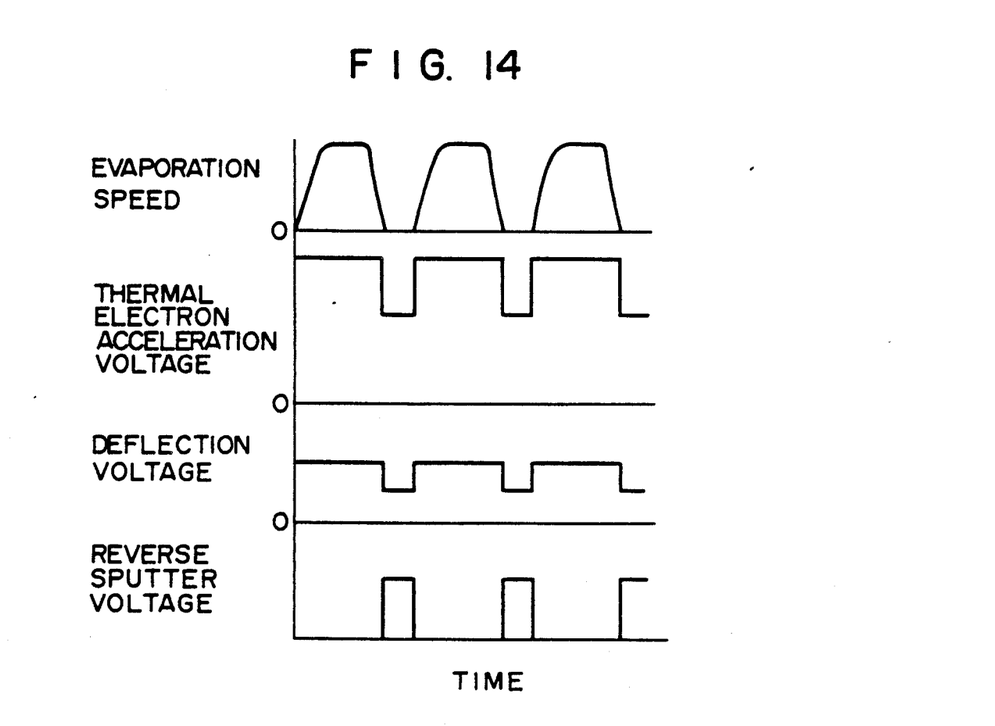
FIG. 14 shows examples of waveforms used in the apparatus shown in FIG. 13.

In Example 4, a target was arranged like the structure of the apparatus of FIG. 1, and a film was formed by sputtering with the aid of ions generated within the vacuum chamber between the ground potential and the target and substrate potentials. The evaporation source may be activated by an electron beam vapor deposition method, resistance heating vapor deposition method, or high frequency heating vapor deposition method. FIG. 13 shows an example of an electron beam evaporation source. Thermal electrons are generated from a filament 13 and accelerated by means of a waveform-controlled thermal electron acceleration voltage power source 11, and controlled to be focused upon an evaporation material 14 by a deflection coil 16 to evaporate it. Reference numeral 12 denotes a filament heating power source, and reference numeral 15 denotes a crucible. Film formation is basically performed by the above operation and switching of a voltage applied to the substrate 8. However, even if an electron beam in the form of pulses is applied to the evaporation material 14, the material cannot be evaporated at once due to its thermal inertia. To avoid this, as shown by waveforms of FIG. 14, during the period while a negative voltage is applied to the substrate for reverse sputter, the electron beam (thermal electron acceleration voltage) is not completely turned off, but a base electron beam is being applied. Since the evaporation material is pre-heated by the base electron beam, the response and control of evaporation of the evaporation material 14 can be improved. Further, if electron beam output waveform from the thermal electron acceleration voltage waveform controlling power source changes, the focus of the electron beam is caused to shift. To avoid this, a voltage to be applied to the deflection coil 16 is caused to synchronize with a thermal electron waveform output (voltage). According to the results of various experiments made by the present apparatus, the x-ray diffraction strength of an Al film at (111) crystal grain orientation was reduced to 30% of Example 1, and the film forming speed became three times as fast as that of Example 1.

EXAMPLE 5

Figure 15:
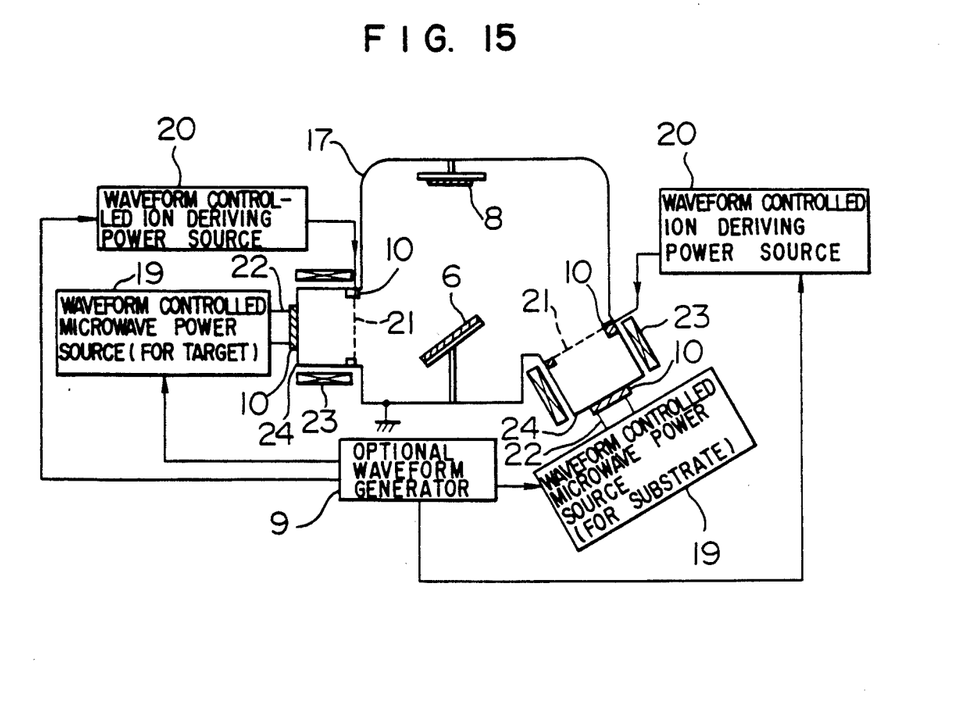
FIG. 15 is a schematic block diagram showing the structure of a still further embodiment of a thin film forming apparatus according to the present invention.

In Example 5 shown in FIG. 15, an ion source for ion impact upon a target 6 and another ion source for ion impact upon a substrate are separately provided, and both the ion sources are alternately switched to form a film and perform a reverse sputter. The ion source may be activated by a microwave method, high frequency method, or thermal electron method. FIG. 15 shows an example of a microwave ion source. Waveform-shaped microwaves generated by waveform controlled microwave power sources 19 in accordance with signals from an optional waveform generator 9 are guided to plasma generating chambers 24 via waveguides 22 to generate plasma. Each of the plasma generating chambers 24 is provided with an ion deriving electrode 21 of a meshed pattern to which a negative voltage is applied from waveform controlled ion deriving power sources 20 to derive ions within a vacuum chamber 17. The ion sources are alternately switched to impinge ions onto the target and substrate to thereby form a film and perform a reverse sputter. A characteristic feature of this method resides in that ion energy can be changed as desired by changing the microwave output or the ion deriving voltage. In addition, since the ion sources are separately provided, there is no interference therebetween. Further, the film forming chamber and the ion sources are separated by the meshed electrodes so that a film can be formed at a vacuum region as high as 10 to 100 times as that at the ion sources. As a result, an adequate vacuum region is broad and the film quality is superior to Example 1. However, the film forming speed was reduced to 40% of Example 1.

As described so far, ion impacts (reverse sputter) are alternately switched to form a film so that the orientation of crystal grains and step coverage can be considerably improved. Further, good orientation results in high tolerance against electromigration so that the file time of Al or Al alloy wiring films on VLSIs can be prolonged, and reliability can be extensively improved. Not only such improved step coverage will become compatible with future wiring processes of VLSIs under perpetual miniaturization, but also can improve the reliability of present VLSIs. Furthermore, film formation under a reactive gas atmosphere allows to obtain a composite film with excellent characteristics which can not be attained by a conventional sputter method and bias sputter method.

We claim:

1. A method for depositing a material of a target on a substrate comprising the steps of:
    placing the target and the substrate opposing each other in a vacuum chamber;
    applying to said target a first negative voltage of a first waveform including a first negative base portion of a first substantially constant negative voltage and a first pulse portion including first pulses each having a first peak more negative than said first constant negative voltage so as to effect sputtering of the target material on said substrate; and
    applying to said substrate a second negative voltage of a second waveform including a second negative base portion of a second substantially constant negative voltage and a second pulse portion including second pulses each having a second peak more negative than said first constant negative voltage in such a manner that said second peak is less negative than said first peak and the second pulses do not substantially overlap with the first pulses so as to effect reverse sputtering of the target material deposited on said substrate.

2. A method according to claim 1, wherein said chamber is grounded to an earth potential.

3. A method according to claim 2, wherein the first pulses are periodically produced with each first pulse continuing for a selected first time interval and the second pulses are periodically produced with each second pulse continuing for a selected second time interval shorter than said first time interval.

4. A method according to claim 2, wherein said first constant negative voltage is more negative than said second constant negative voltage.

5. A method according to claim 1, wherein the target is made of a material which provides desired barrier effects when deposited on the substrate and pulse periods of said first and second pulses are selected to cause said target material to be deposited on said substrate in the form of a composite film of different crystal structures.

6. A method for depositing a material of a target on a substrate comprising the steps of:
    placing the target and the substrate opposing each other in a vacuum chamber containing a gas atmosphere;
    applying to said target a first negative voltage of a first waveform including a first negative base portion of a first substantially constant negative voltage and a first pulse portion including first pulses each having a first peak more negative than said first constant negative voltage so as to effect sputtering of the target material on said substrate by impinging of ions of the gas atmosphere on the target; and
    applying to said substrate a second negative voltage of a second waveform including a second negative base portion of a second substantially constant negative voltage and a second pulse portion including second pulses each having a second peak more negative than said first constant negative voltage in such a manner that said second peak is less negative than said first peak and the second pulses do not substantially overlap with the first pulses so as to effect reverse sputtering of the target material deposited on said substrate by impinging of ions of the gas atmosphere on the substrate.

7. A method according to claim 6, wherein the target is made of a material which provides desired barrier effects when deposited on the substrate and pulse periods of said first and second pulses are selected to cause said target material to be deposited on said substrate in the form of a composite film of different crystal structures.

8. A method according to claim 6, wherein said target material is titanium and the gas atmosphere includes argon, nitrogen and oxygen so that a film of titanium nitride is formed on the substrate.

9. A method according to claim 8, wherein pulse periods of said first and second pulses are selected so that said titanium nitride film is formed with a composite structure of granular and columnar crystals.

10. A method for depositing a material of a target on a substrate comprising the steps of:
 placing the target and the substrate opposing each other in a vacuum chamber having introduced therein a gas atmosphere of argon or helium;
 applying to said target a first negative voltage of a first waveform including a first negative base portion of a first substantially constant negative voltage and a first pulse portion including first pulses each having a first peak more negative than said first constant negative voltage so as to effect sputtering of the target material on said substrate by impinging of ions of the gas atmosphere on the target; and
 applying to said substrate a second negative voltage of a second waveform including a second negative base portion of a second substantially constant negative voltage and a second pulse portion including second pulses each having a second peak more negative than said first constant negative voltage in such a manner that said second peak is less negative than said first peak and the second pulses do not substantially overlap with the first pulses so as to effect reverse sputtering of the target material deposited on said substrate by impinging of ions of the gas atmosphere on the substrate.

11. A method for depositing a material of a target on a substrate comprising the steps of:
 placing the target and the substrate opposing each other in a vacuum chamber grounded to an earth potential;
 applying to said target a first negative voltage of a first waveform including a first negative base portion of a first substantially constant negative voltage and a first pulse portion including first pulses each having a first peak more negative than said first constant negative voltage so as to effect sputtering of the target material on said substrate; and
 applying to said substrate a second negative voltage of a second waveform including a second negative base portion of a second substantially negative constant voltage and a second pulse portion including second pulses each having a second peak more negative than said first constant negative voltage in such a manner that said second peak is less negative than said first peak and the second pulses do not substantially overlap with the first pulses so as to effect reverse sputtering of the target material deposited on said substrate.

12. A method for forming a thin film of a material of a target on a substrate comprising the steps of:
 placing the target and the substrate opposing each other in a vacuum chamber;
 applying to said target a first negative voltage of a first waveform including a first negative base portion of a first substantially constant negative voltage and a first pulse portion including first pulses each having a first peak more negative than said first constant negative voltage so as to effect sputtering of the target material on said substrate to form a thin film; and
 applying to said substrate a second negative voltage of a second waveform including a second negative base portion of a second substantially constant negative voltage and a second pulse portion including second pulses each having a second peak more negative than said first constant negative voltage in such a manner that said second peak is less negative than said first peak and the second pulses do not substantially overlap with the first pulses so as to effect reverse sputtering of the target material deposited on said substrate.

13. A method of claim 12, wherein an argon gas atmosphere to be ionized for sputtering is introduced in said vacuum chamber at an atmospheric pressure lower than $10^{-3}$ Torr.

14. A method for depositing a material of a target on a substrate comprising the steps of:
 placing the target and the substrate opposing each other in a vacuum chamber;
 applying to said target a first negative voltage of a first waveform including a first negative base portion of a first substantially constant negative voltage and a first pulse portion including first pulses each having a first peak more negative than said first constant negative voltage so as to effect sputtering of the target material on said substrate;
 applying to said substrate a second negative voltage of a second waveform including a second negative base portion of a second substantially constant negative voltage and a second pulse portion including second pulses each having a second peak more negative than said first constant negative voltage in such a manner that said second peak is less negative than said first peak and the second pulses do not substantially overlap with the first pulses so as to effect reverse sputtering of the target material deposited on said substrate; and
 applying high frequency power between said target and said substrate in said vacuum chamber.

15. A method for depositing a material of a target on a substrate comprising the steps of:
 placing the target and the substrate opposing each other in a vacuum chamber;
 applying to said target a first negative voltage including a first negative base portion of a first substantially constant negative voltage and a first high frequency portion which is alternately made active and inactive so as to effect sputtering of the target material on said substrate; and
 applying to said substrate a second negative voltage including a second negative base portion of a second substantially constant negative voltage and a second high frequency portion which is alternately made active and inactive in such a manner that a peak voltage value of said first high frequency portion during its active state is more negative than a peak voltage value of said second high frequency portion during its active state and the active state of said first high frequency portion does not substantially overlap with the active state of said second high frequency portion so as to effect reverse sputtering of the target material deposited on said substrate.

16. A method for depositing a material of a target on a substrate comprising the steps of:
placing the target and the substrate opposing each other in a vacuum chamber;
applying to said target evaporating power of a first waveform which provides alternately active and inactive states so as to evaporate the target material to be deposited on said substrate; and
applying to said substrate a negative voltage of a second waveform which provides alternately active and inactive states so as to effect reverse sputtering of the target material deposited on said substrate wherein said active state of said first waveform does not substantially overlap with the active state of said second waveform.

17. A method according to claim 16, wherein said evaporating power is produced by an electron beam.

18. An apparatus for forming a thin film of a material of a target on a substrate, said apparatus comprising:
means for placing the target and the substrate at positions opposing each other in a vacuum chamber;
means for applying to said target a first negative voltage of a first waveform including a first negative base portion of a first substantially constant negative voltage and a first pulse portion including first pulses each having a first peak more negative than said first constant negative voltage so as to effect sputtering of the target material on said substrate; and
means for applying to said substrate a bias current of a second negative voltage of a second waveform including a second negative base portion of a second substantially constant negative voltage and a second pulse portion including second pulses each having a second peak more negative than said first constant negative voltage in such a manner that said second peak is less negative than said first peak and the second pulses do not substantially overlap with the first pulses so as to effect reverse sputtering of the target material deposited on said substrate.

19. An apparatus according to claim 18, further comprising:
a coil provided in said vacuum chamber at a space between the positions where the target and the substrate are placed;
means for applying high frequency power to said coil for thereby generating plasma;
a sensor for detecting the bias current applied to said substrate; and
means for controlling said high frequency power applied to said coil so as to maintain said bias current substantially constant.

20. An apparatus for forming a thin film of a material of a target on a substrate, said apparatus comprising:
means for placing the target and the substrate at positions opposing each other in a vacuum chamber;
an optical waveform generator for generating first and second waveforms, said first waveform including a first negative base portion of a first substantially constant negative voltage and a first pulse portion including first pulses each having a first peak more negative than said first constant negative voltage so as to effect, when a negative voltage having said first waveform is applied to said target, sputtering of the target material on said substrate, and said second waveform including a second negative base portion of a second substantially constant negative voltage and a second pulse portion including second pulses each having a second peak more negative than said first constant negative voltage in such a manner that said second peak is less negative than said first peak and the second pulses do not substantially overlap with the first pulses so as to effect, when a negative voltage having said second waveform is applied to said substrate, reverse sputtering of the target material deposited on said substrate;
a sputter power source connected to said target and receiving a signal indicative of said first waveform from said optional waveform generator to apply to said target a first negative voltage having said first waveform; and
a reverse-sputter power source connected to said substrate and receiving a signal indicative of said second waveform from said optional waveform generator to apply to said substrate a second negative voltage having said second waveform.

* * * * *